(12) United States Patent
Tolle et al.

(10) Patent No.: US 7,602,229 B2
(45) Date of Patent: Oct. 13, 2009

(54) HIGH FREQUENCY CONTROL OF A SEMICONDUCTOR SWITCH

(75) Inventors: Tobias Georg Tolle, Turnhout (DE); Thomas Dürbaum, Baiersdorf (DE); Georg Sauerländer, Aachen (DE); Toni Lopez, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 313 days.

(21) Appl. No.: 10/570,743

(22) PCT Filed: Aug. 25, 2004

(86) PCT No.: PCT/IB2004/051558

§ 371 (c)(1),
(2), (4) Date: Mar. 6, 2006

(87) PCT Pub. No.: WO2005/025065

PCT Pub. Date: Mar. 17, 2005

(65) Prior Publication Data

US 2006/0290388 A1    Dec. 28, 2006

(30) Foreign Application Priority Data

Sep. 8, 2003    (EP) .................................. 03102722

(51) Int. Cl.
*H03K 17/72*    (2006.01)
(52) U.S. Cl. ......................... 327/440; 327/443; 327/108

(58) Field of Classification Search .................. 327/581, 327/434, 442, 108, 440, 443, 427
See application file for complete search history.

(56) References Cited

U.S. PATENT DOCUMENTS

| | | | | |
|---|---|---|---|---|
| 5,010,261 | A | | 4/1991 | Steigerwald |
| 5,140,201 | A | * | 8/1992 | Uenishi ...................... 327/108 |
| 5,204,561 | A | * | 4/1993 | Rischmuller ................ 327/427 |
| 5,264,736 | A | * | 11/1993 | Jacobson .................... 327/365 |
| 6,414,370 | B1 | * | 7/2002 | Nagasu et al. ............... 257/575 |
| 6,441,673 | B1 | * | 8/2002 | Zhang ......................... 327/423 |
| 6,650,169 | B2 | * | 11/2003 | Faye et al. .................. 327/404 |
| 6,819,088 | B2 | * | 11/2004 | Shenai et al. ............... 323/222 |
| 7,091,753 | B2 | * | 8/2006 | Inoshita ...................... 327/108 |
| 2006/0192437 | A1 | * | 8/2006 | Tolle et al. .................. 307/113 |

OTHER PUBLICATIONS

Maksimovic D Ed—Institute of Electrical and Electronics Engineers: "A MOS Gate Drive With Resonant Transitions"; Proceedings of the Annual Power Electronics Specialist Conference Massachusetts Jun. 25-27; 1991 New York IEEE, U.S.; vol. Conf. 22; pp. 527-532.

* cited by examiner

*Primary Examiner*—Dinh T. Le

(57) ABSTRACT

Resonant gate driver circuits provide for efficient switching of, for example, a MOSFET. However, often an operation of the resonant gate driver circuit does not allow for an application where high switching frequencies are required. According to the present invention, a pre-charging of the inductor of the resonant gate driver circuit is performed. This allows for a highly efficient and fast operation of the MOSFETs.

15 Claims, 3 Drawing Sheets

HIGH FREQUENCY CONTROL OF A SEMICONDUCTOR SWITCH

The present invention relates to the control of a semiconductor switch and, more specifically, to the operation of a resonant driver circuit for a semiconductor switch. In particular, the present invention relates to a method of operating a resonant driver circuit for driving a semiconductor switch, to a control circuit for controlling a resonant gate driver circuit for driving a semiconductor switch and to an electronic driver circuit for a semiconductor switch.

It is known in the art of power converters that the kind of gate driver circuit coupled to power MOSFET switches has a crucial influence on the efficiency of the power converter, especially at high frequencies. Thus, various driver schemes have been developed. The gate drive power loss is proportional to the switching frequency and is a major limitation in the design of high efficiency power converters in the MHz region. One approach to improve the gate drive power loss is to use a resonant gate driver circuit as described in a paper entitled "A MOS gate drive with resonant transitions" by D. Maksimović, $22^{nd}$ Annual IEEE Power Electronics Specialists' Conference (PESC), Jun. 23 to 27, 1991, page 523 to 527. This paper describes a gate drive that provides quasi square wave gate-to-source voltage with low impedance between gate and source terminals in both on and off states. The equivalent gate capacitance of the power MOS transistor is charged and discharged in a resonant circuit, so that energy stored in the equivalent gate capacitance is returned to the power circuit of the driver.

Such resonant gate driver circuits may, for example, be used in power electronics with MOSFETs that work with high switching frequencies. Thus, they may, for example, be used in switch mode power supplies (SMPS). Also, they may be adapted for applications with special requirements relating to size, flatness, EMI or dynamics, such as voltage regulator modules (VRMs) for data processors, SMPS for flat displays and SMPS for audio sets with AM/FM tuners.

At high switching frequencies in the MHz region or higher, both an efficient and a fast driving of the MOSFETs becomes more important. Efficient driving is necessary to reduce gate driver losses. Fast driving is necessary to keep switching losses of the power transistor within acceptable limits.

To achieve efficient driving, the application of resonance drivers, which are more efficient than, for example, hard switching drivers, is becoming more and more desirable. However, known resonant drivers usually do not achieve the same switching speed as hard switching drivers and are thus often not suitable for applications that have higher switching frequencies.

It is an object of the present invention to provide for a fast and efficient operation of a resonant driver circuit for driving a semiconductor switch.

According to an exemplary embodiment of the present invention, the above object may be solved by a method, as set forth in claim 1, of operating a resonant driver circuit for driving a semiconductor switch. The driver circuit includes a first switch connecting a power supply to a control terminal of the semiconductor switch, a second switch connected between ground and the control terminal of the semiconductor switch, and a third switch for connecting the control terminal of the semiconductor switch via an inductor to a potential. According to this exemplary embodiment of the present invention, the inductor is pre-charged by switching the third switch before initiating a switching of the semiconductor switch.

Advantageously, due to the pre-charging of the inductor, a higher initial current may be applied to the control terminal of the semiconductor switch, thus, advantageously, both a fast and an efficient switching of the semiconductor switch may be provided. This improved operation combines both efficiency and fast driving which are necessary for applications which have higher switching frequencies, for example, switching frequencies in the MHz region or higher.

According to another exemplary embodiment of the present invention as set forth in claim 2, the pre-charging of the inductor is performed by building up an inductor current prior to the starting of the switching of the semiconductor switch, which, according to another exemplary embodiment of the present invention as set forth in claim 3, is done by providing a first time period, during which the second and third switches are switched on. According to this exemplary embodiment of the present invention, a simple and efficient method is provided for operating the resonant driver circuit of the semiconductor switch.

Claims 4 to 7 provide for further exemplary embodiments of the present invention.

According to another exemplary embodiment of the present invention as set forth in claim 8, a control circuit is provided for controlling a resonant gate driver circuit for driving a semiconductor switch. This control circuit comprises a switch controller for controlling a switching of the first, second and third switches of the resonant gate driver circuit, such that the inductor is pre-charged before initiating a switching of the semiconductor switch.

Claim 9 provides for an exemplary embodiment of the control circuit according to the present invention.

According to another exemplary embodiment of the present invention as set forth in claim 10, an electronic driver circuit for driving a semiconductor switch is provided.

It may be seen as the gist of an exemplary embodiment of the present invention that the inductor of the resonant driver circuit is pre-charged before a switching of the semiconductor switch is initiated. This may be performed by switching a switch connected between ground and the control terminal of the semiconductor switch and another switch connecting the control terminal of the semiconductor switch via an inductor to and a capacitor, such that a time period is provided, during which both switches are switched on. Furthermore, a very efficient off-switching may be provided by the provision of a second time period, during which a switch connected between a power supply and the control terminal of the semiconductor switch and the switch connecting the control terminal via the inductor to ground are switched on. Preferably, as will be described in further detail in the following description of an exemplary embodiment of the present invention, the switching speed of the resonant gate driver performing a hard switching of the semiconductor switch may be increased. Furthermore, these overlap times provide for an extra current in the inductor, due to which every transition may be purely resonant, which, advantageously, may avoid high loss and EMI-unfriendly pull-downs to zero.

Advantageously, this may provide for a fast and efficient, i.e. power efficient operation of the semiconductor switch, such as, for example, a MOSFET, allowing that such circuits may be applied to VRMs for data processors, SMPS for flat displays or SMPS for audio sets.

These and other aspects of the present invention will become apparent from and elucidated with reference to the embodiments described hereinafter.

Exemplary embodiments of the present invention will be described in the following, with reference to the following drawings.

Figure 1:
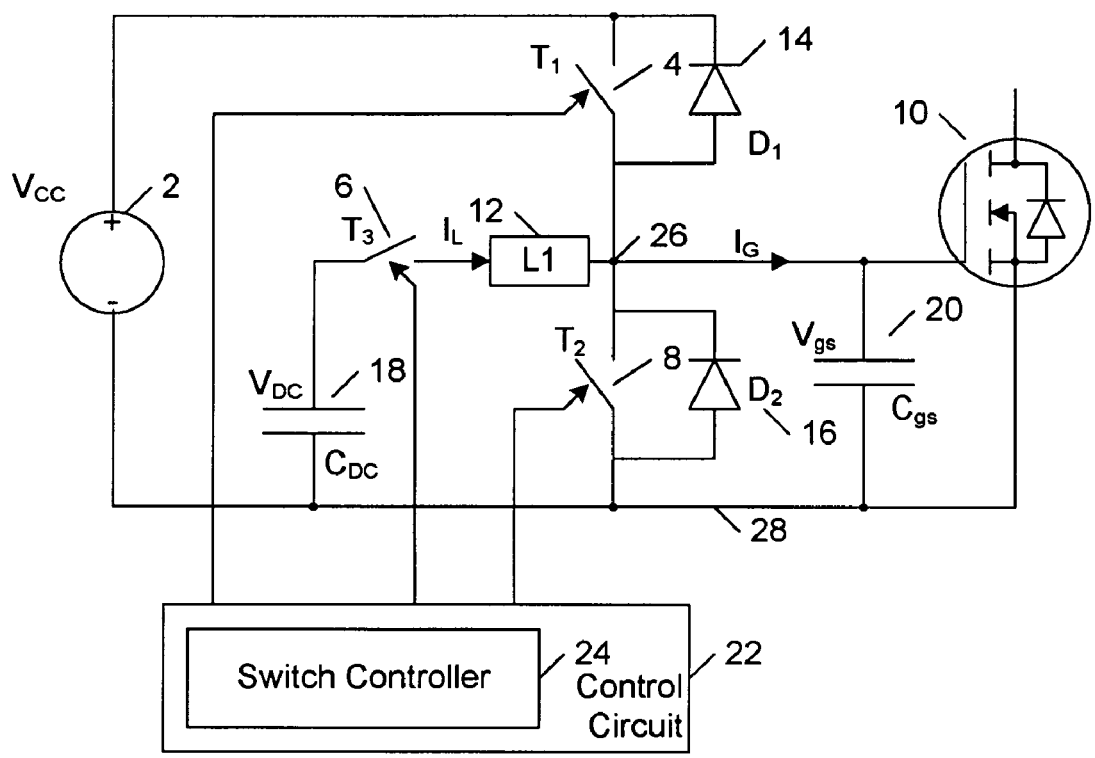
FIG. 1 shows a simplified circuit diagram of a resonant gate driver circuit, including an exemplary embodiment of a control circuit for controlling the resonant gate driver circuit.

FIG. 1 shows a simplified circuit diagram of a resonant gate driver for driving a MOSFET 10, such as a power MOSFET. In spite of the fact that this exemplary embodiment of the present invention is explained with respect to the driving of a MOSFET 10, it should be understood that the present invention is also applicable for most kinds of voltage controlled semiconductor switches, such as, for example, IGBTs. Furthermore, the present invention may also be applied to current controlled semiconductors, such as bipolar transistors, thyristors and triacs. Reference numeral 22 designates an exemplary embodiment of a control circuit for controlling the operation of the resonant gate driver circuit in accordance with a method according to the present invention.

Reference numeral 2 in FIG. 1 designates a power supply generating a power supply voltage $V_{cc}$. A first switch $T_1$ designated with reference numeral 4 is provided between the power supply voltage $V_{cc}$ and a control terminal 26 of the MOSFET 10, namely the gate of the MOSFET 10. Between the gate 26 and ground, i.e. the "−" side of the power supply 2, there is provided a second switch $T_2$ designated with reference numeral 8. Furthermore, the gate 26 is connected via an inductor 12, a third switch $T_3$ designated with reference numeral 6 and a capacitance $C_{DC}$ designated with reference numeral 18 to ground, i.e. the "−" side of the power supply 2. A capacitance $C_{gs}$ provided between the gate 26 and a source terminal 28 of the MOSFET 10, which is also connected to ground, may represent the gate-source capacitance of the MOSFET 10. Preferably, $T_1$, $T_2$ are transistors, such as bipolar transistors or MOSFETs. Preferably, $T_3$ is a bidirectional switch able to connect and block in both directions. $T_3$ may be realized by e.g. an anti-series connection of two MOSFETs.

A voltage occurring across the capacitance $C_{DC}$ is referred to as $V_{DC}$, a voltage across the capacitance $C_{GS}$ is referred to as $V_{GS}$ and a current flowing through the inductor $L_1$ designated with reference numeral 12 is referred to as $I_L$.

Furthermore, there is provided a first diode $D_1$ designated with reference numeral 14, which is parallel to the switch $T_1$. Also, there is a second diode $D_2$, designated with reference numeral 16, which is provided parallel to switch $T_2$. The first and second diodes $D_1$ and $D_2$ may be the intrinsic body diodes of $T_1$ and $T_2$ when $T_1$ and $T_2$ are MOSFET switches.

The control circuit 22 for controlling an operation of the resonant gate driver circuit for driving the MOSFET 10 includes a switch controller 24. According to an aspect of this exemplary embodiment of the present invention, the switch controller controls a switching of the first, second and third switches, $T_1$, $T_2$ and $T_3$, such that the inductor $L_1$ is pre-charged before initiating an on-switching of the MOSFET 10. For this, the control circuit is connected to the first, second and third switches $T_1$, $T_2$ and $T_3$. In particular, for initiating the on-switching of the MOSFET 10, the switch controller 24 is adapted to perform the pre-charging of the inductor $L_1$ by switching the second and third switches $T_2$ and $T_3$ such that a first time period is provided, during which the second and third switches $T_2$ and $T_3$ are switched on. Furthermore, before initiating an off-switching of the MOSFET 10, the switch controller 24 is adapted to control the switching of the first and second switches $T_1$ and $T_3$, such that a second time period is provided, during which the first and third switches $T_1$ and $T_3$ are switched on.

Figure 2:
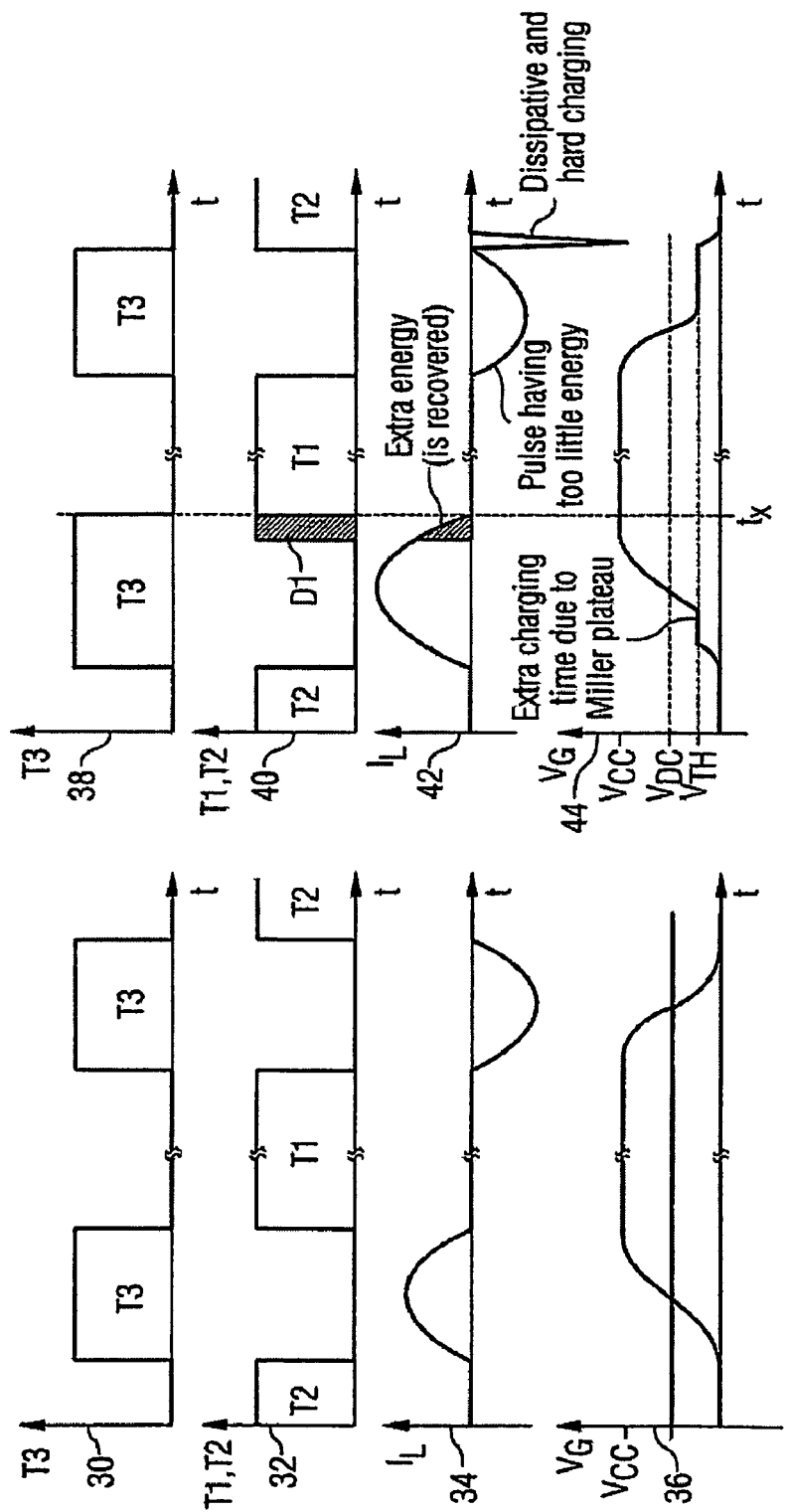
FIG. 2 shows timing charts, wherein the timing charts on the left side of FIG. 2 shows an idealized switching scheme and important state variables for driving zero voltage switching (ZVS)-MOSFETs and a duty cycle of 50%, and the timing charts on the right side of FIG. 2 show problems which may occur when hard switched MOSFETs are driven with a duty cycle of 50%.

The left side of FIG. 2 shows timing charts of a possible switching scheme for switching the first, second and third switches $T_1$, $T_2$ and $T_3$ for an idealized power MOSFET with linear $C_{GS}$ and no current into the reverse transfer capacitance $C_{DG}$. The right side of FIG. 2 shows timing charts depicting problems that may occur in FIG. 1 when MOSFET 10 is switched without ZVS, i.e. under hard switching conditions with a duty cycle of 50%.

Reference numeral 30 designates a timing chart depicting the switching operation of the third switch $T_3$. Timing chart 32 depicts the switching operation of the first and second switches $T_1$ and $T_2$. Timing chart 34 depicts the current $I_L$ through the inductor $L_1$ and timing chart 36 depicts the voltage at the gate 26.

As may be taken from timing charts 30 to 36, the on-switching of the third switch $T_3$ together with the off-switching of the second switch $T_2$ at the same point causes a current $I_L$ to rise. At the same time, the gate voltage $V_{GS}$ rises and eventually reaches $V_{CC}$. Then, the MOSFET 10 is fully switched on. At this time, the third switch $T_3$ is switched off and the first switch $T_1$ is switched on.

For switching the MOSFET 10 off, the first switch $T_1$ is switched off and the third switch $T_3$ is switched on at the same time, which causes the current $I_L$ to flow in the opposite direction. Hence, the gate voltage $V_{GS}$ decreases, eventually causing the MOSFET 10 to be switched off.

Timing charts 38 to 44 on the right side of FIG. 2 show the problems that may occur when the switching scheme depicted in timing charts 30 to 36 is applied to the resonance driver circuit of FIG. 1, i.e. when the MOSFET 10 is hard switched according to this scheme.

Timing chart 38 shows the switching of the third switch $T_3$, timing chart 40 shows the switching of the switches $T_1$ and $T_2$. Timing chart 42 shows the current $I_G$ into the gate 26 and timing chart 44 shows the gate voltage $V_{GS}$.

As may be taken from timing chart 40, before the off-switching of the third switch $T_3$ at $t_x$ and before the actual on-switching of the first switch $T_1$ at $t_x$, $T_1$ appears to be on (but is not switched on), since at this time a current may flow through the diode $D_1$, which is parallel to the first switch $T_1$.

At the hard switched MOSFETs as shown in timing charts 38 to 44, the Miller plateau depicted in timing chart 44 compromises the switching symmetry by changing the gate-source capacitance $C_{gs}$ to a very non-linear element.

The Miller plateau is caused by a reloading current for a gate-drain capacitance $C_{gd}$, which has to flow through the gate. In particular, the gate-drain capacitance $C_{gd}$ and the gate source capacitance $C_{gs}$ are voltage dependent capacitances and therefore the capacitance value changes, depending on the voltage that appears across the drain source and also across the gate source of a semiconductor device, such as a MOSFET. The change in $C_{gd}$ is more significant than $C_{gs}$, simply because the voltage that appears across it is much higher than that across $C_{gs}$. These changes in capacitance have an influence on the voltage that appears at the gate of the device, namely the gate voltage. This influence is called the Miller plateau. According to Mohan et al "Power Electronics, Converters, Applications and Design", ISBN 0-471-58404-8, this Miller plateau causes the turn-off and turn-on rise and fall times on the switching transients and causes the gate voltage to flatten out as shown in timing chart 44.

This results in a surplus of energy in $L_1$, indicated in timing chart 42 at the turn-on, and a lack of energy during turn-off. This lack of coil current results in a high loss and slow turn-off.

Because of the pulse having too little energy, as depicted in timing chart 42, a dissipative and hard charging is caused, which may cause EMI problems in surrounding electronics. Furthermore, a problem that may occur in the driving topology depicted in FIG. 2 is that the inductor 1 slows down the charge flow into the gate and thus the gate voltage rises.

Figure 3:
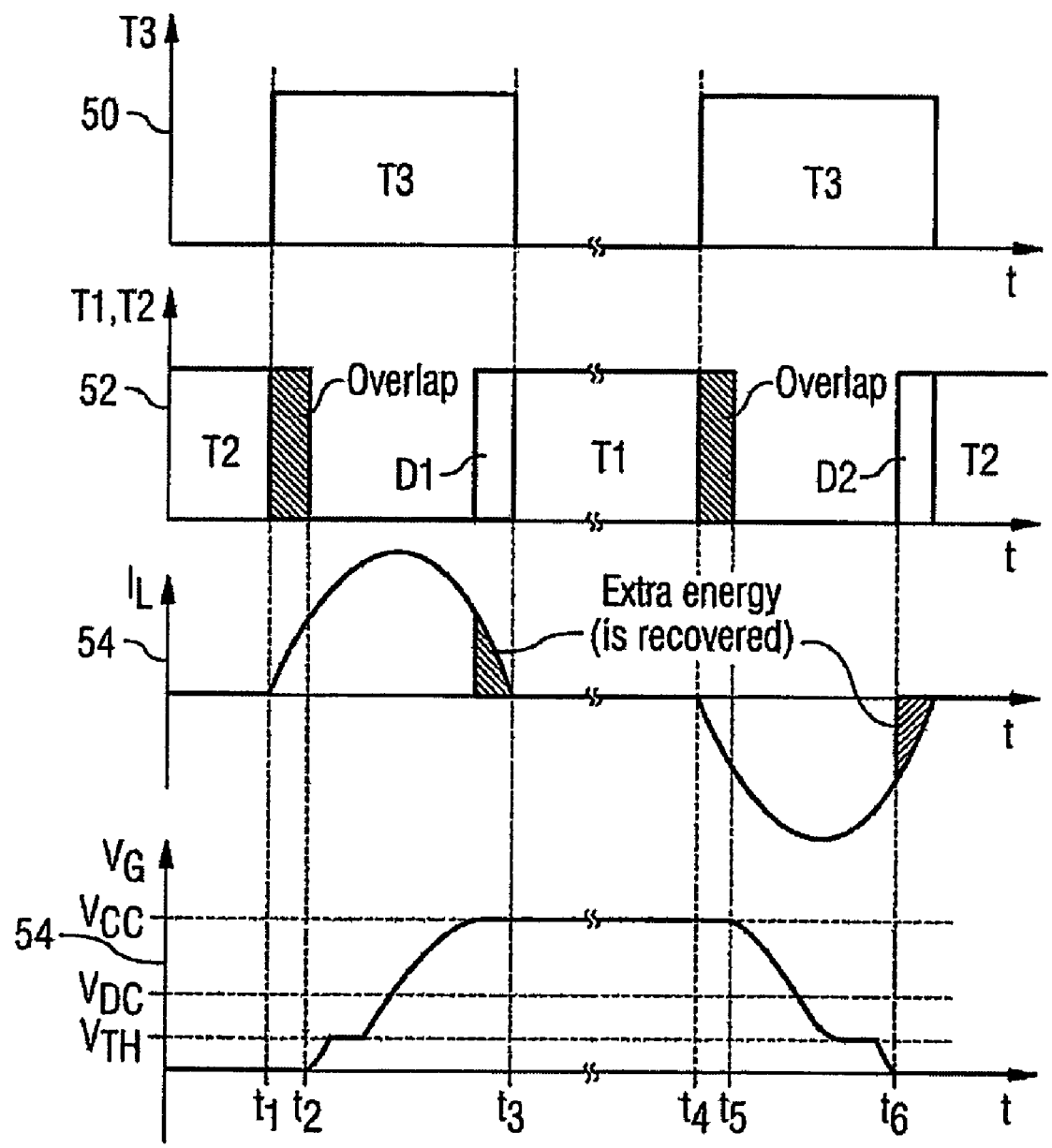
FIG. 3 shows timing charts depicting an exemplary embodiment of a method of operating the control circuit depicted in FIG. 1 according to the present invention.

FIG. 3 shows timing charts 50, 52, 54 and 56 of an exemplary embodiment of a method of operating the control circuit 22 depicted in FIG. 1, i.e. of performing a switching of the first, second and third switches, $T_1$, $T_2$ and $T_3$ according to the present invention.

Timing chart 50 shows a switching operation performed at the third switch $T_3$ and thus shows the switching operation of the third transistor $T_3$, controlled by the switch controller 24. The timing chart 52 shows the switching operation of the first and second switches $T_1$ and $T_2$ and thus the control of the switching operation of $T_1$ and $T_2$ performed by the switch controller 24. Timing chart 54 shows the current $I_L$ occurring due to the switching operation of switches $T_1$, $T_2$ and $T_3$ and timing chart 54 depicts or sketches the voltage $V_{GS}$ occurring at the gate 26.

As may be taken from FIG. 3, according to this exemplary embodiment of the present invention, a pre-charging of the inductor $L_1$ is performed before initiating an on-switching of the MOSFET 10 by switching the second and third switches $T_2$ and $T_3$. In particular, the inductor $L_1$ is pre-charged by building up an inductor current $I_L$ (timing chart 54) prior to the initiation of the on-switching of the semiconductor switch, i.e. prior to the off-switching of $T_2$ at $t_2$. In other words, a time period [$t_1$; $t_2$] is provided, where the second switch $T_2$ and the third switch $T_3$ are switched on. Thus, a current $I_L$ is built up into the inductor $L_1$ before the actual on-switching of the MOSFET 10 starts at $t_2$.

Furthermore, before an actual off-switching of the MOSFET 10 at $t_5$ is initiated by the off-switching of the first switch $T_1$, another time period [$t_4$; $t_5$] is provided, during which the first and third switches $T_1$ and $T_3$ are switched on.

In other words, according to the driving scheme according to this exemplary embodiment of the present invention, an overlap time is provided between $T_2$ and $T_3$ and/or $T_1$ and $T_3$ respectively. Due to this, an inductor current $I_L$ is built up prior to the actual switching action of the MOSFET 10.

Due to this, advantageously, a much higher initial current charges the gate of the MOSFET 10 and thus allows for a faster charging of the gate capacitance of the MOSFET 10. Furthermore, advantageously, an amount of charge flowing into and out of $C_{DC}$ can be controlled by the switching controller 24 by controlling the length of the overlap time between $T_2$ and $T_3$ and/or $T_1$ and $T_3$. Due to this, advantageously, the voltage $V_{DC}$ across the capacitance $C_{DC}$ can be controlled or regulated. An extra current caused in $L_1$ (timing chart 54) by providing these overlap times, may advantageously cause that every transition, i.e. every switching of the MOSFET 10 may be purely resonant, which avoids that any high loss and EMI-unfriendly pull-down to zero occurs. Thus, a situation where the pulse has too little energy and the dissipative and hard charging causes EMI problems as depicted in timing chart 42, is avoided. Furthermore, according to an aspect of this exemplary embodiment of the present invention, the extra energy in the inductor $L_1$ indicated in timing chart 54 is recovered into $V_{CC}$ after transition. Furthermore, as may be taken from a comparison of timing charts 44 and 56, the length of the Miller plateau may advantageously be reduced by the switching scheme depicted in FIG. 3.

According to a further aspect of this exemplary embodiment of the present invention, the switching controller 24 is furthermore adapted to regulate $V_{DC}$ such that it is only slightly above the threshold voltage $V_{TH}$, corresponding to the Miller plateau level by controlling the overlap times between $T_2$ and $T_3$ and/or $T_1$ and $T_3$. By this, the symmetry of switching on and off may be at least partly improved.

Furthermore, according to the present invention, advantageously, $V_{DC}$ may be controlled to any level that helps to avoid dissipative and hard charging of the gate (of the power MOSFET) and at the same time to reduce extra stored charges in the inductor. The optimum voltage in this respect is within the range between Vth and 0.5 Vcc according to the present invention. In known circuits and methods to deploy them, $V_{DC}$ is dependent on the duty cycle of the power MOSFET, which may be disadvantageous. According to an exemplary embodiment of the present invention, advantageously, it may be possible to use such a resonant gate driver, as depicted in FIG. 1, even if the converter has not a constant duty cycle of 50%. In other words, according to the present invention, the converter may be operated with duty cycles other than 50%.

The invention claimed is:

1. Method of operating a resonant driver circuit for driving a semiconductor switch, wherein the driver circuit includes a first switch for connecting a power supply to a control terminal of the semiconductor switch, a second switch connected between ground and the control terminal of the semiconductor switch and a third switch for connecting the control terminal of the semiconductor switch via an inductor to a potential, the method comprising the steps of:
    providing a first switch that is configured to couple a first supply voltage to a control terminal of the semiconductor switch;
    providing a second switch that is configured to couple a second supply voltage to the control terminal of the semiconductor switch;
    providing a third switch that is configured to couple a potential to the control terminal of the semiconductor switch via an inductor; and
    providing a first capacitor switchably coupled to the inductor via the third switch for providing the potential to the control terminal;
    providing a control circuit that is configured to control one or more of the first, second, and third switches so as to provide a current in the inductor via a common current path before initiating a switching of the semiconductor switch; and
    pre-charging the inductor by switching the third switch before initiating a switching of the semiconductor switch.

2. The method of claim 1, wherein the inductor is precharged by building up an inductor current prior to the starting of the switching of the semiconductor switch.

3. The method of claim 2, wherein the inductor current is built up by providing a first time period, during which the second and third switches are switched on.

4. The method of claim 2, wherein, the inductor current is built up by providing a second time period, during which the first and third switches are switched on.

5. The method of claim 4, wherein an on-switching of the semiconductor switch is performed by off-switching the second switch and on-switching the third switch; and wherein an off-switching of the semiconductor switch is performed by off-switching the first switch and on-switching the third switch.

6. The method of claim 1, wherein a voltage at a connection between the inductor and a capacitance is controlled by the switching of the first, second and third switches, such that it reaches an optimum voltage above a Miller plateau voltage.

7. The method of claim 1, wherein the semiconductor switch is a MOSFET or IGBT.

8. A control circuit for controlling a resonant gate driver circuit for driving a semiconductor switch, wherein the driver circuit includes:

a first switch for connecting a power supply to a control terminal of the semiconductor switch, a second switch connected between ground and the control terminal of the semiconductor switch and a third switch for connecting the control terminal of the semiconductor switch via an inductor to a potential, a first capacitor switchably coupled to the inductor via the third switch for providing the potential to the control terminal;

the control circuit comprising:

a switch controller for controlling a first switching of the first, second and third switches such that the inductor is pre-charged before initiating a switching of the semiconductor switch.

9. The control circuit of claim 8, wherein, for initiating a second switching of the semiconductor switch, the pre-charging of the inductor is performed by providing a first time period, during which the second and third switches are switched on; and wherein, for initiating a third switching of the semiconductor switch, a second time period is provided, during which the first and third switches are switched on.

10. A driver circuit for driving a semiconductor switch, comprising:

a first switch that is configured to couple a first supply voltage to a control terminal of the semiconductor switch;

a second switch that is configured to couple a second supply voltage to the control terminal of the semiconductor switch;

a third switch that is configured to couple a potential to the control terminal of the semiconductor switch via an inductor;

a first capacitor switchably coupled to the inductor via the third switch for providing the potential to the control terminal; and a control circuit that is configured to control one or more of the first, second, and third switches so as to provide a current to precharge the inductor before initiating a switching of the semiconductor switch.

11. The driver circuit of claim 10, wherein the control circuit is configured to provide the current in the inductor by switching the third circuit on and concurrently switching one of the first and second switches on.

12. The driver circuit of claim 11, wherein the control circuit is configured to alternately switch the first and second switches on.

13. The driver circuit of claim 11, wherein the control circuit is configured to initiate switching of the semiconductor switch by switching the one of the first and second switches off while the third switch is switched on.

14. The driver circuit of claim 13, wherein the control circuit is configured to maintain a state of the semiconductor switch by switching the third switch off while the one of the first and second switch is switched on.

15. The driver circuit of claim 10, wherein the third switch is a bidirectional switch.

* * * * *